United States Patent
Rachakonda et al.

(10) Patent No.: US 10,006,953 B2
(45) Date of Patent: Jun. 26, 2018

(54) PERSONAL WEARABLE SYSTEM THAT DETECTS HAZARDOUS VOLTAGES AND INDICATES DIRECTION OF THE SOURCE

(71) Applicant: Honeywell International Inc., Morris Plains, NJ (US)

(72) Inventors: Nagaraju Rachakonda, Andhra Pradesh (IN); Antonio Vitucci, Wauconda, IL (US); Mehabube Rabbanee Shaik, Andhra Pradesh (IN); Ataur Rahman, Andhra Pradesh (IN)

(73) Assignee: Honeywell International Inc., Morris Plains, NJ (US)

( * ) Notice: Subject to any disclaimer, the term of this patent is extended or adjusted under 35 U.S.C. 154(b) by 0 days. days.

(21) Appl. No.: 15/327,885

(22) PCT Filed: Jul. 10, 2015

(86) PCT No.: PCT/US2015/039869
§ 371 (c)(1),
(2) Date: Jan. 20, 2017

(87) PCT Pub. No.: WO2016/014260
PCT Pub. Date: Jan. 28, 2016

(65) Prior Publication Data
US 2017/0205454 A1    Jul. 20, 2017

Related U.S. Application Data

(60) Provisional application No. 62/027,441, filed on Jul. 22, 2014.

(51) Int. Cl.
*G01R 29/08* (2006.01)
*G08B 3/10* (2006.01)
(Continued)

(52) U.S. Cl.
CPC ....... *G01R 29/085* (2013.01); *G01R 29/0857* (2013.01); *G08B 3/10* (2013.01);
(Continued)

(58) Field of Classification Search
CPC .............. G01R 29/0814; G01R 29/085; G01R 29/0857
See application file for complete search history.

(56) References Cited

U.S. PATENT DOCUMENTS

2010/0125438 A1* 5/2010 Audet ................ G01R 29/0857
702/189
2010/0274100 A1* 10/2010 Behar .................. A61B 5/0002
600/301
(Continued)

FOREIGN PATENT DOCUMENTS

| FR | 2786068 A1 | 5/2000 | |
| JP | 2005109530 A * | 4/2005 | .............. H04Q 7/38 |
| WO | 2006121867 A2 | 11/2006 | |

OTHER PUBLICATIONS

International Preliminary Report on Patentability and Written Opinion dated Jan. 24, 2017.

*Primary Examiner* — Hongmin Fan
(74) *Attorney, Agent, or Firm* — Wood, Phillips, Katz, Clark & Mortimer

(57) ABSTRACT

A personal voltage detection system comprises a garment to be worn by a user and carrying a plurality of electric field sensors each facing a different direction. Each sensor comprises a transducer sensing electric field in transmitting a wireless signal representing field strength for an associated direction. An alert device is in operative communication with the plurality of sensors and comprises a control configured to monitor field strength for each sensor and determine existence of an alarm condition responsive to field strength being above a pre-select level and to generate an
(Continued)

alarm signal indicating the associated direction of the alarm condition.

18 Claims, 11 Drawing Sheets

(51) Int. Cl.
    *G08B 5/22*     (2006.01)
    *H04M 1/725*     (2006.01)
    *G08B 21/18*     (2006.01)

(52) U.S. Cl.
    CPC ............ *G08B 5/22* (2013.01); *G08B 21/182* (2013.01); *H04M 1/72569* (2013.01)

(56) References Cited

U.S. PATENT DOCUMENTS

| | | | |
|---|---|---|---|
| 2012/0176376 A1* | 7/2012 | Kim | H04W 4/026 345/419 |
| 2012/0199755 A1* | 8/2012 | Generazio | G01J 1/42 250/395 |
| 2014/0084045 A1* | 3/2014 | Yang | A61B 5/6804 228/175 |
| 2015/0223772 A1* | 8/2015 | Shi | A61B 8/0825 600/459 |

* cited by examiner

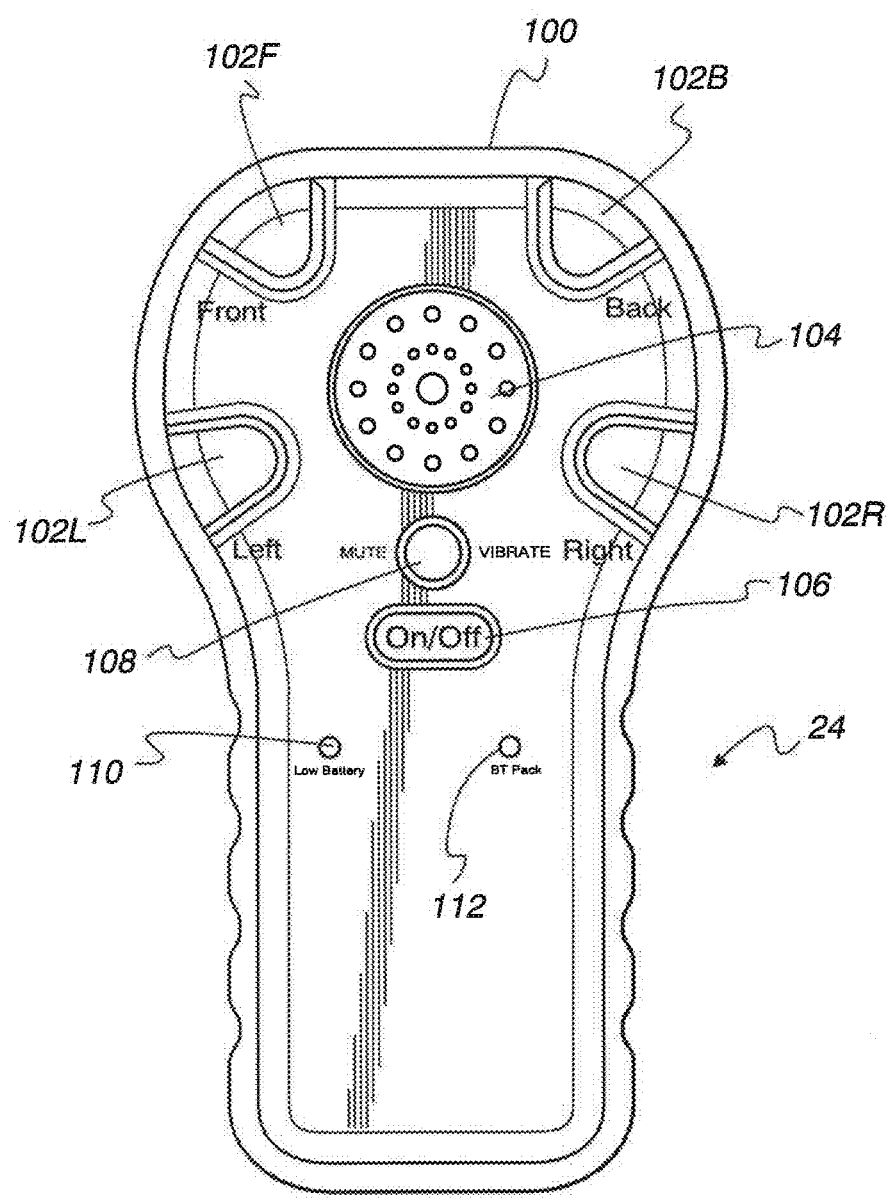

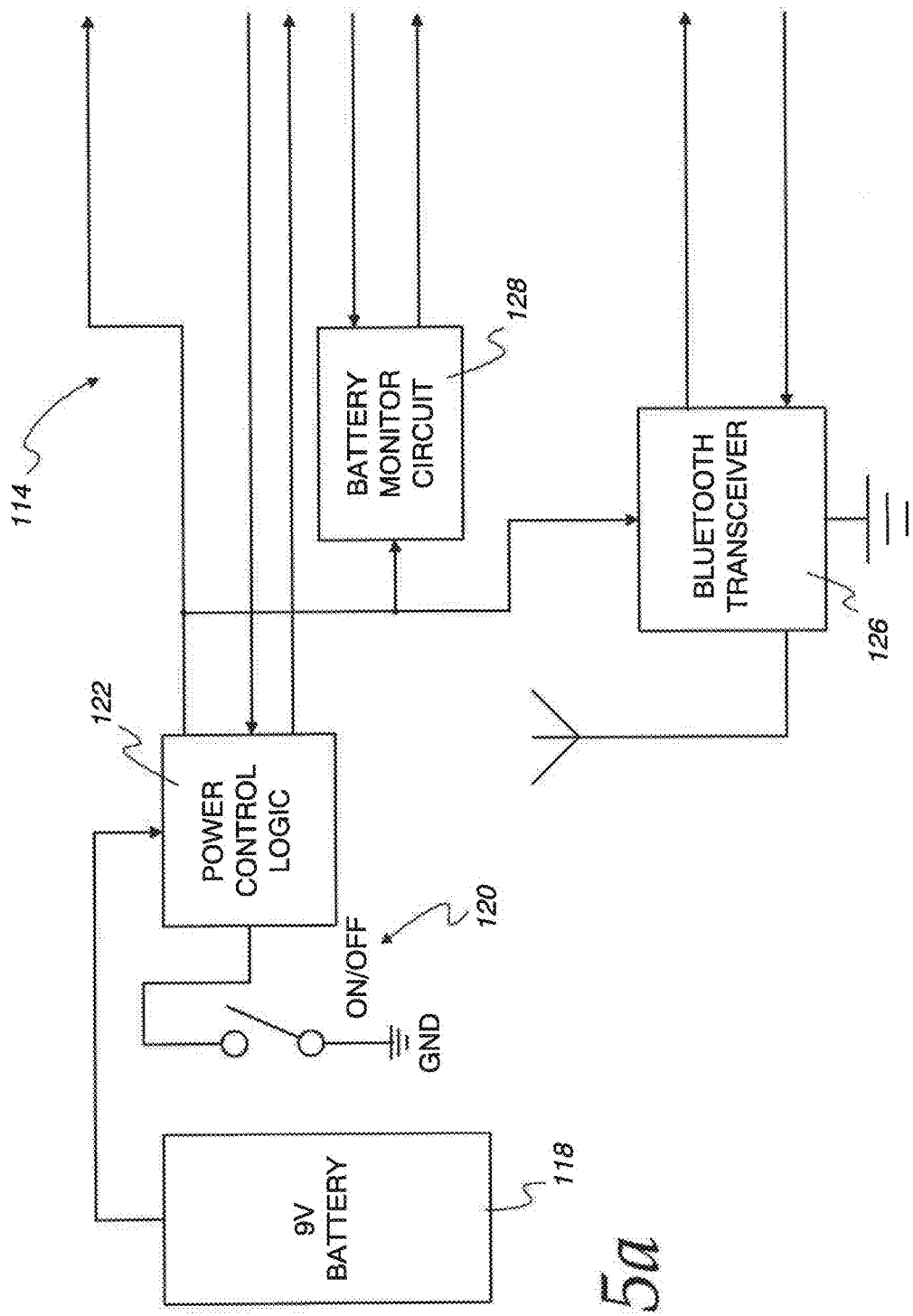

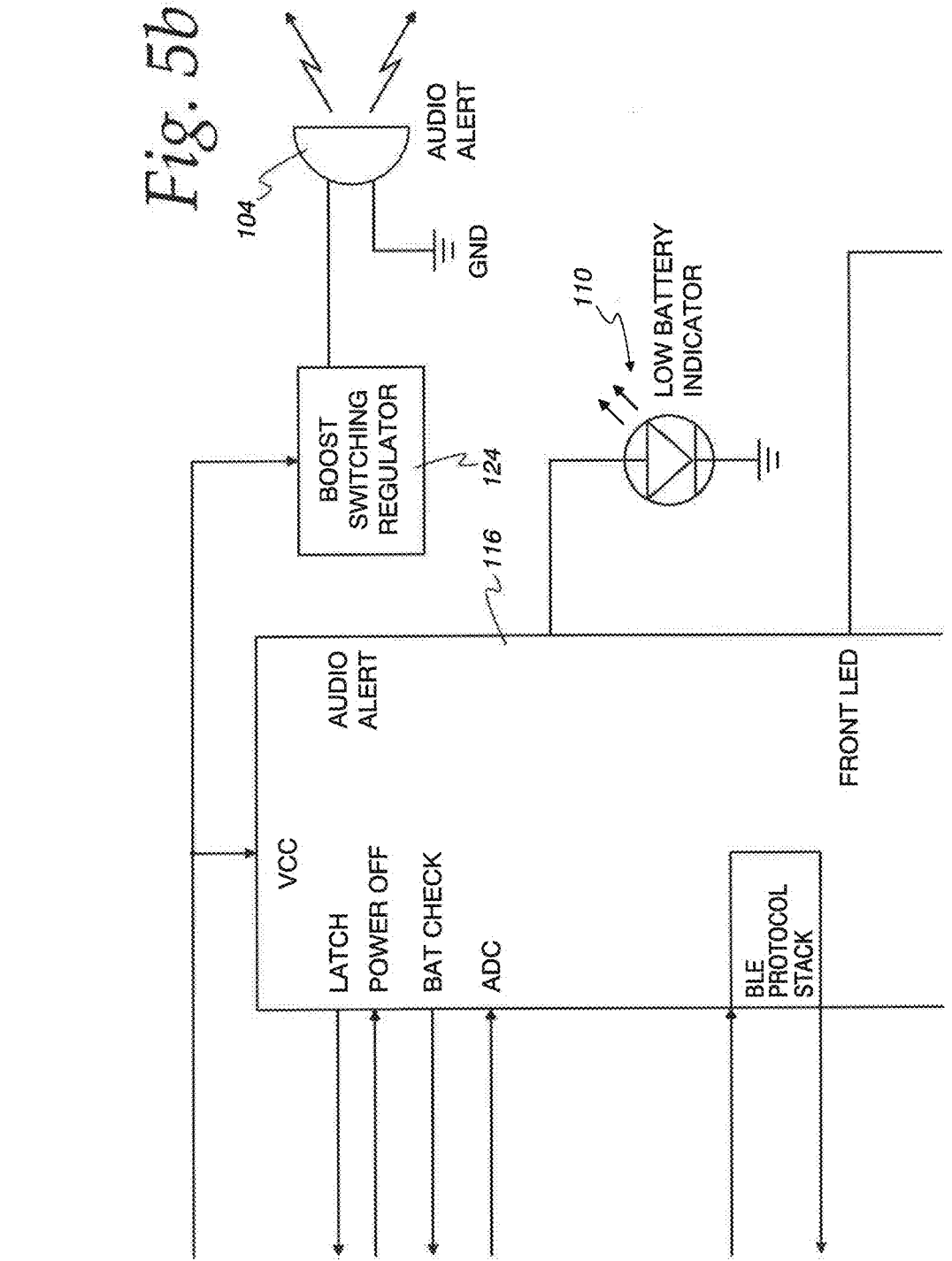

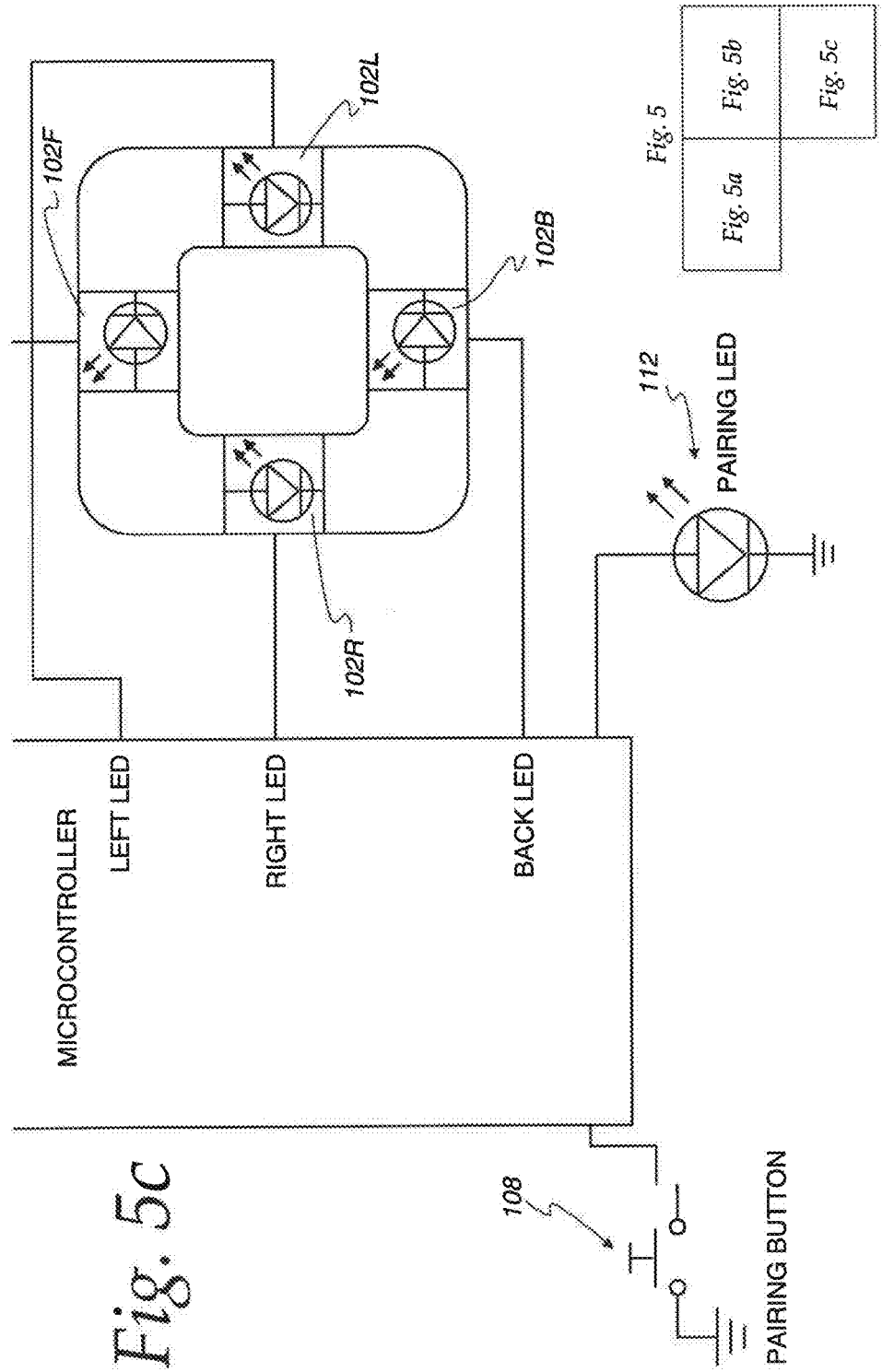

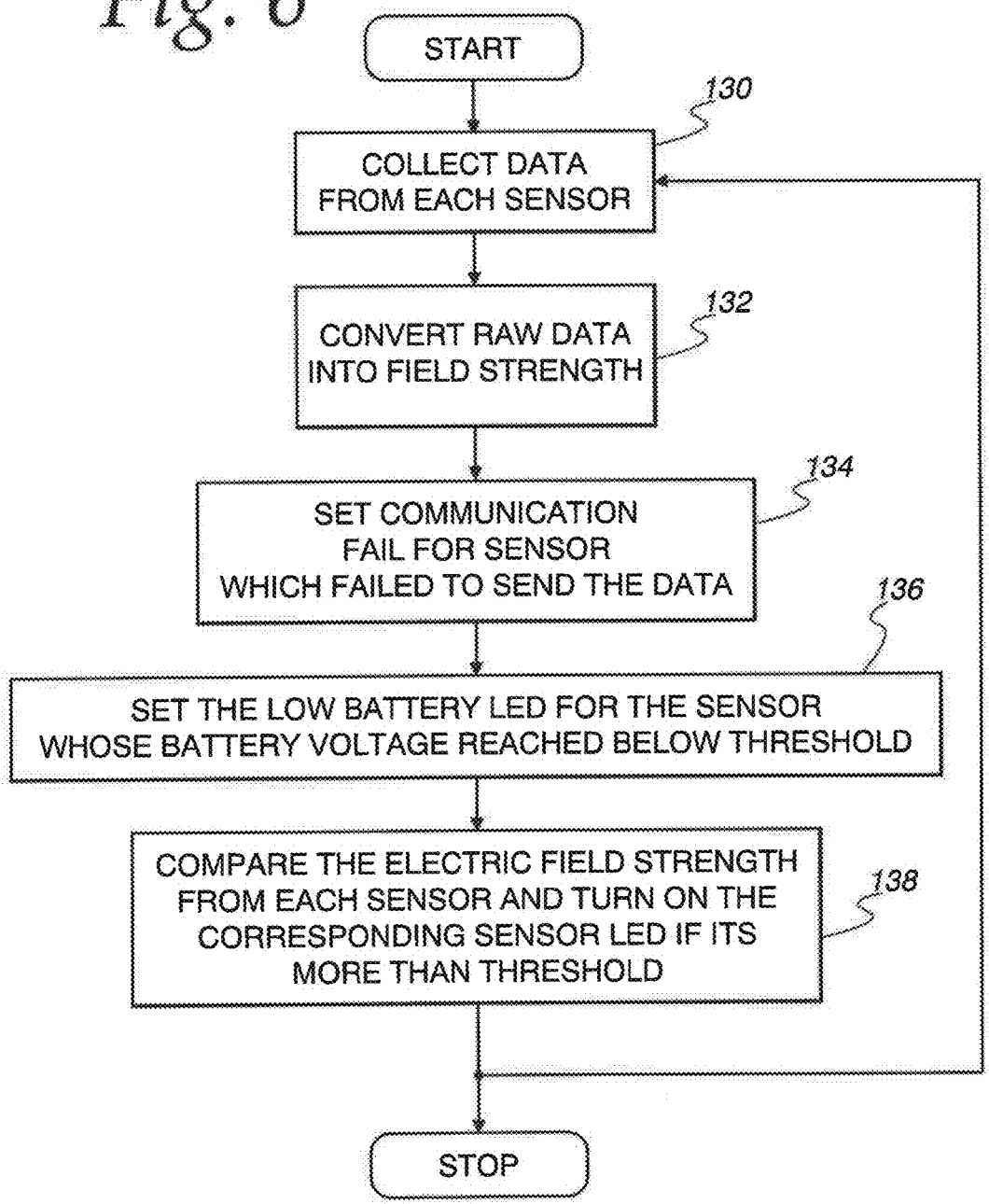

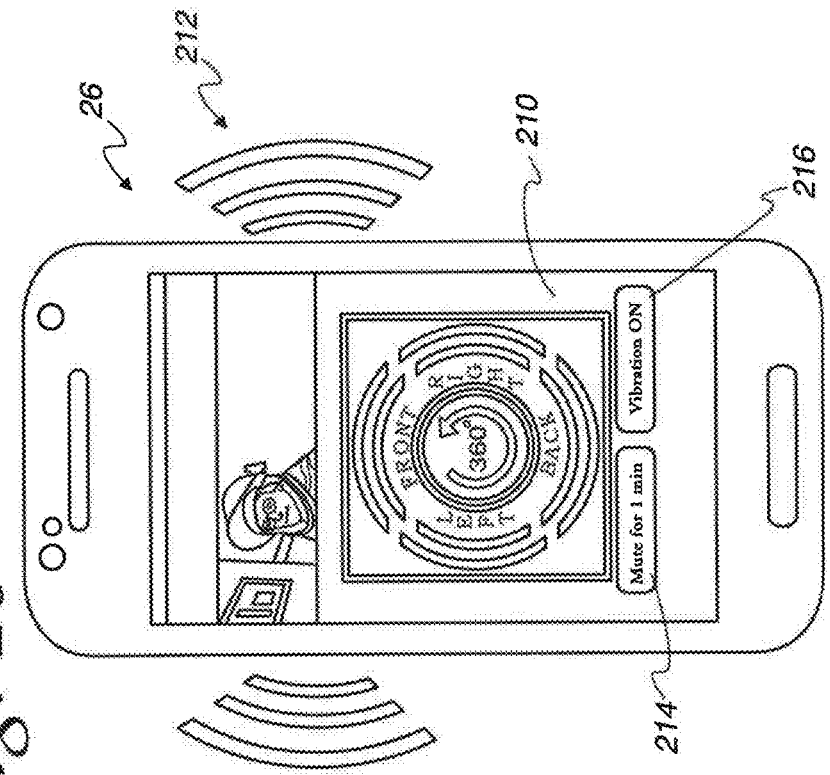
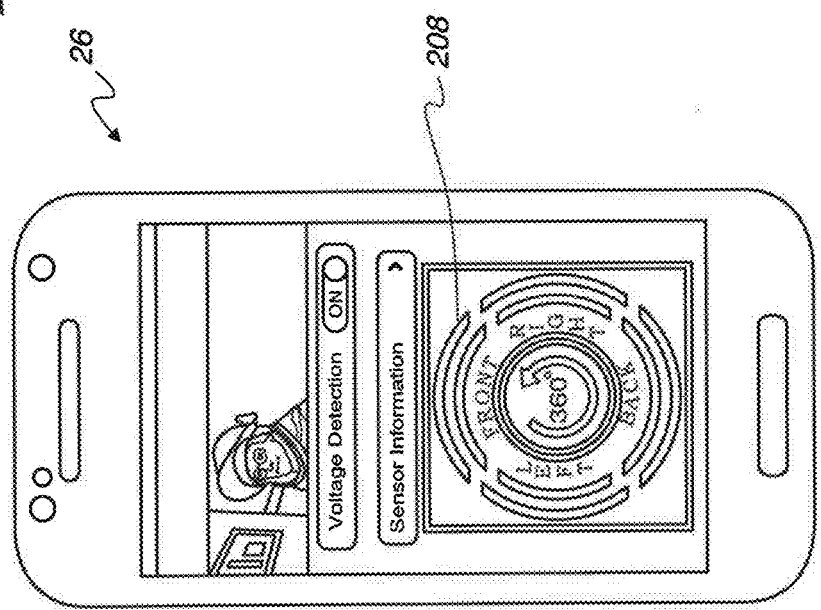

PERSONAL WEARABLE SYSTEM THAT DETECTS HAZARDOUS VOLTAGES AND INDICATES DIRECTION OF THE SOURCE

CROSS-REFERENCE TO RELATED APPLICATIONS

This application claims priority of Provisional Ser. No. 62/027,441, filed Jul. 22, 2014, and Appln. No. PCT/US15/39869, filed Jul. 10, 2015, the disclosures of which are hereby incorporated by reference in their entirety.

FEDERALLY SPONSORED RESEARCH OR DEVELOPMENT

Not Applicable.

MICROFICHE/COPYRIGHT REFERENCE

Not Applicable.

FIELD

This application relates to wearable electric field sensors and, more particularly, to a system that detects hazardous voltages and indicates direction of the source.

BACKGROUND

Persons working in the vicinity of high voltage electrical fields must take precautions to maintain appropriate distance from the source of the high voltage. For example, workers around high voltage transmission lines must avoid coming too close to the lines. Also, first responders or the like who may be working in the vicinity of downed transmission lines must also avoid coming in contact with the lines.

Existing wearable personal voltage detectors are directional and do not detect a voltage source which is not in the direction of the device. Normally, these devices are worn on the user's front at mid torso or on a belt clip, or the like. If the user is walking backwards or to the sides, the detector will not detect the voltage source as the human body stops the electric field from reaching the detector.

Such existing personal voltage detectors are used for when the direction or location of the potential field is known. However, these devices cannot address the challenging needs and uncertain scenarios such as in a disaster rescue operation where the first responder is focused on rescue rather than potential electric hazards in the vicinity.

Thus, it would be advantageous to have a system that can detect live electrical sources in multiple directions allowing the user to concentrate on the core work while ensuring the safety of the individual from dangerous voltage sources.

SUMMARY

As described herein, a personal wearable system detects hazardous voltages surrounding the user for alerting industrial workers and indicating the direction of the source.

There is disclosed in accordance with one aspect a personal voltage detection system comprising a plurality of wearable electric field sensors. Each sensor is adapted to be worn on an outer side of a user's body, each facing a different direction. Each sensor comprises a transducer sensing electric field and transmitting a wireless signal representing field strength for an associated direction. An alert device is in operative communication with the plurality of sensors and comprises a control configured to monitor field strength for each sensor. The alert device determines existence of an alarm condition responsive to field strength being above a preselect level and generates an alarm signal indicating the associate direction of the alarm condition.

It is a feature that the alert device comprises an audio output generating an audio signal responsive to the alarm condition.

It is another feature that the alert device comprises an indicator associated with each direction and the control illuminates the indicator for the associated direction of the alarm condition.

It is yet another feature that the alert device may comprise a graphic display with the indicators for each direction.

It is yet another feature that the alert device may comprise a Smartphone.

It is still another feature that the alert device includes an indicator to indicate communication status with the plurality of sensors.

It is still a further feature that the alert device comprises an indicator associated with each sensor and the control varies each indicator to indicate communication status for the associated sensor.

It is still another feature that the sensors and the alert device communicate using short-wave length radio waves.

It is an additional feature that the sensors and the alert device are battery powered.

There is disclosed in accordance with another aspect, a personal voltage detection system comprising a garment to be worn by a user and carrying a plurality of electric field sensors each facing a different direction. Each sensor comprises a transducer sensing electric field in transmitting a wireless signal representing field strength for an associated direction. An alert device is in operative communication with the plurality of sensors and comprises a control configured to monitor field strength for each sensor and determine existence of an alarm condition responsive to field strength being above a pre-select level and to generate an alarm signal indicating the associated direction of the alarm condition.

Other features and advantages will be apparent from a review of the entire specification, including the appended claims and drawings.

BRIEF DESCRIPTION OF THE DRAWINGS

FIG. 4 is a front view of an alert device used with the personal voltage detection system of FIG. 1a;

FIG. 5 is a block diagram of a circuit for the alert device;

FIG. 6 is a flow diagram illustrating a program in the microcontroller of FIG. 5; and FIGS. 7-10 illustrate an alert device in the form of a Smartphone including a series of displays illustrating operation of an application program for the alert device.

DETAILED DESCRIPTION

A personal wearable system is described herein which detects hazardous voltages essentially 360° around the user for alerting a worker and indicating the direction of a hazardous voltage source. The system consists of four wearable electric field sensors embedded into a high visibility jacket or worn on an outer side of the body, one each of the front, back, left and right. Each sensor measures electric field strength and communicates to an alert device using short-wave length radio waves. The alert device, which may be a mobile phone, or other personal alert device, collects the data from each sensor, processes and generates an alarm with directional visual indication and an audio alert.

Figure 1A:
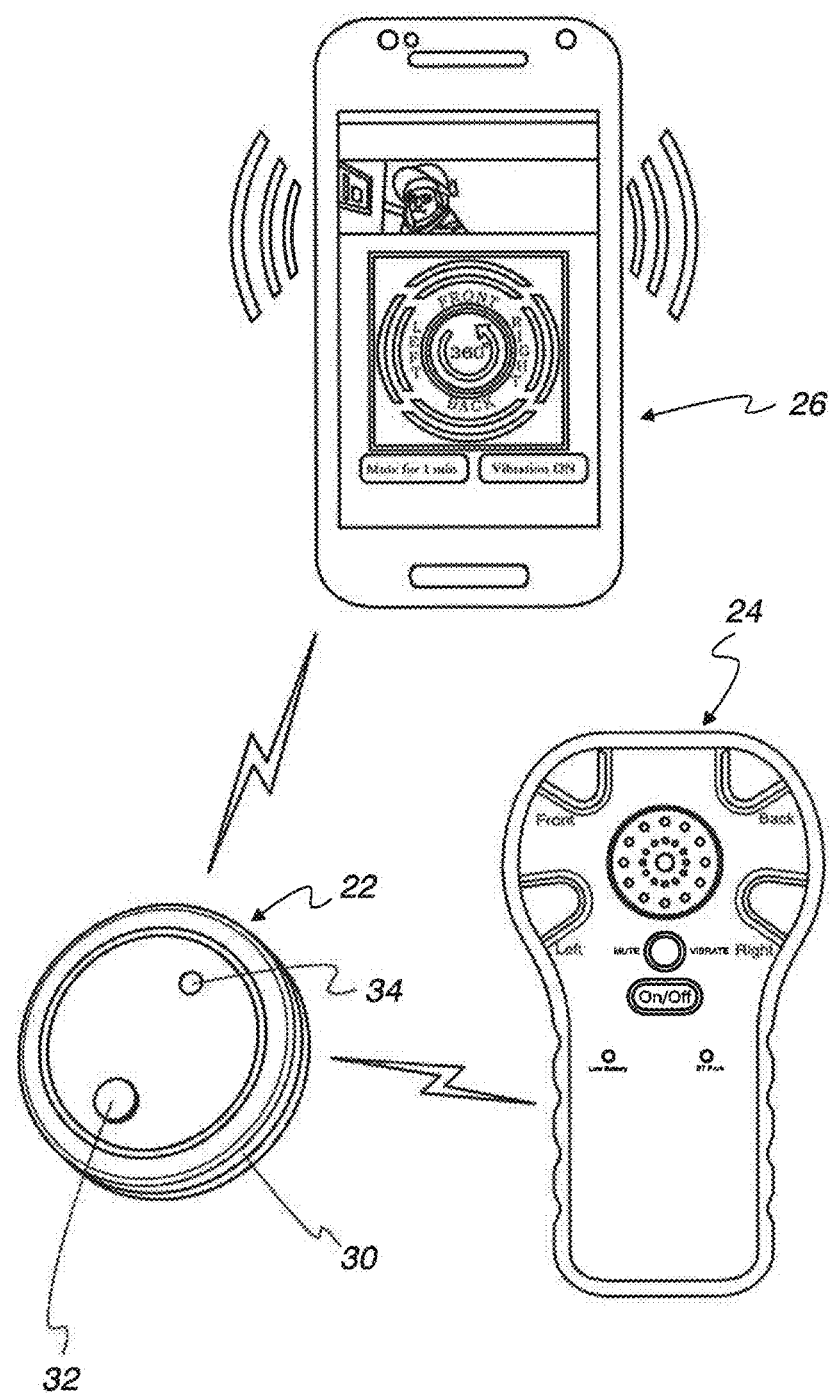
FIG. 1a illustrates a personal voltage detection system as described herein.
Figure 1B:
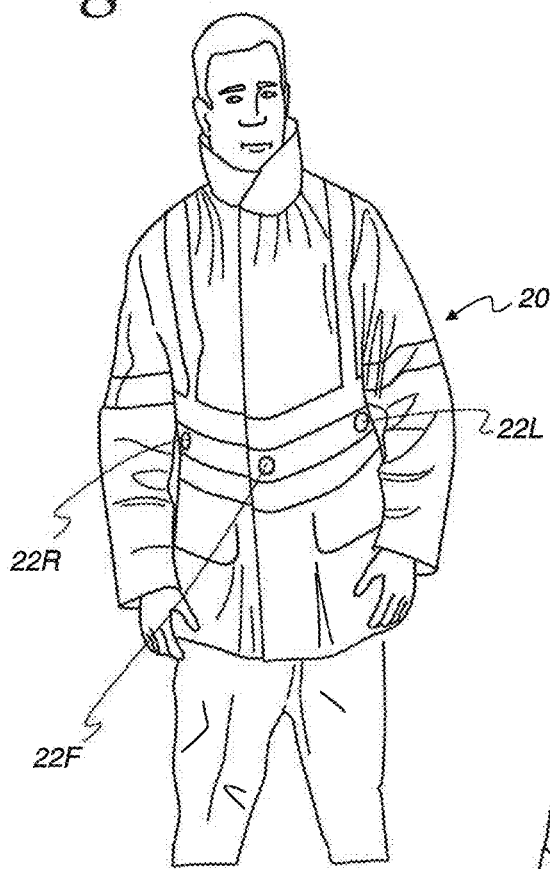
FIG. 1b illustrates a garment including a front, left and right electric field sensors.
Figure 1C:
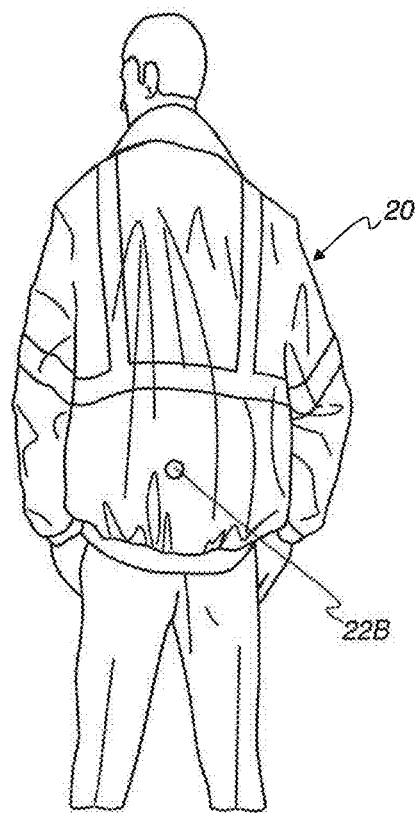
FIG. 1c illustrates the garment with a back electric field sensor.

Referring initially to FIGS. 1a, 1b and 1c, an exemplary garment 20 is in the form of a jacket. A front sensor 22F, a back sensor 22B, a left side sensor 22L and a right side sensor 22R are each embedded in the jacket 20. As such, the front sensor 22F senses an electric field in front of the user, the left sensor 22L senses an electric field to a left side of the user, the back sensor 22B senses an electric field in back of the user, and the right sensor 22R senses an electric field to the right of the user. Each of the sensors 22L, 22R, 22F and 22B is identical in construction, other than having a unique address or identification code. Hereafter, each sensor may be described generically with the numeral 22. Each of the sensors 22 communicates, as shown in FIG. 1a, with a personal alert device 24 and/or a Smartphone 26, configured as a personal alert module, using Bluetooth® technology (Bluetooth is a registered trademark of Bluetooth Sig, Inc.).

The sensor 22 comprises a disk-shaped housing 30 including a push button 32 and LED 34. A transducer circuit for the sensor 22 is illustrated by the electrical circuit in FIG. 2. The sensor 22 is powered by a coin cell battery 36. A sensor antenna 38 is connected to a signal amplifier circuit 40. The sensor antenna 38 may comprise a small conductive plate which acts as an antenna to pick up any voltage from an electrical field in front of the sensor and generates a low voltage signal in response to the electric field strength, as is known. The low voltage signal is amplified by the signal amplifier 40 and is then supplied to a band pass filter 42. The band pass filter 42 is adapted to pass signals the frequency band of 50 to 60 Hz corresponding to the typical power line frequencies. Thus, frequencies outside of this range are filtered out. The filtered signal is passed to a signal conditioning circuit 44 which develops appropriate analog signal levels input to a microcontroller 46. The microcontroller 46 is also connected to the push button 32 and the LED 34. Also, the microcontroller 46 is connected to a Bluetooth® transceiver 48. The transceiver 48 transmits and receives wireless signals using short-wave length radio waves. As will be apparent, other communication technologies can also be used for wireless communications. Prior to use, the bush button 32 is depressed to pair the sensor 22 with the alert device 24. The LED 34 confirms that the pairing is successful.

The microcontroller 46 may take any known form and includes a processor and associated memory for operating the sensor 22 in accordance with a stored program. The microcontroller 46 is adapted to receive the amplified and filtered signal from the antenna 38 representing sensed field strength and periodically transmit the signal over the transceiver 48 to the personal alert device 24 or the Smartphone 26.

Figure 2:
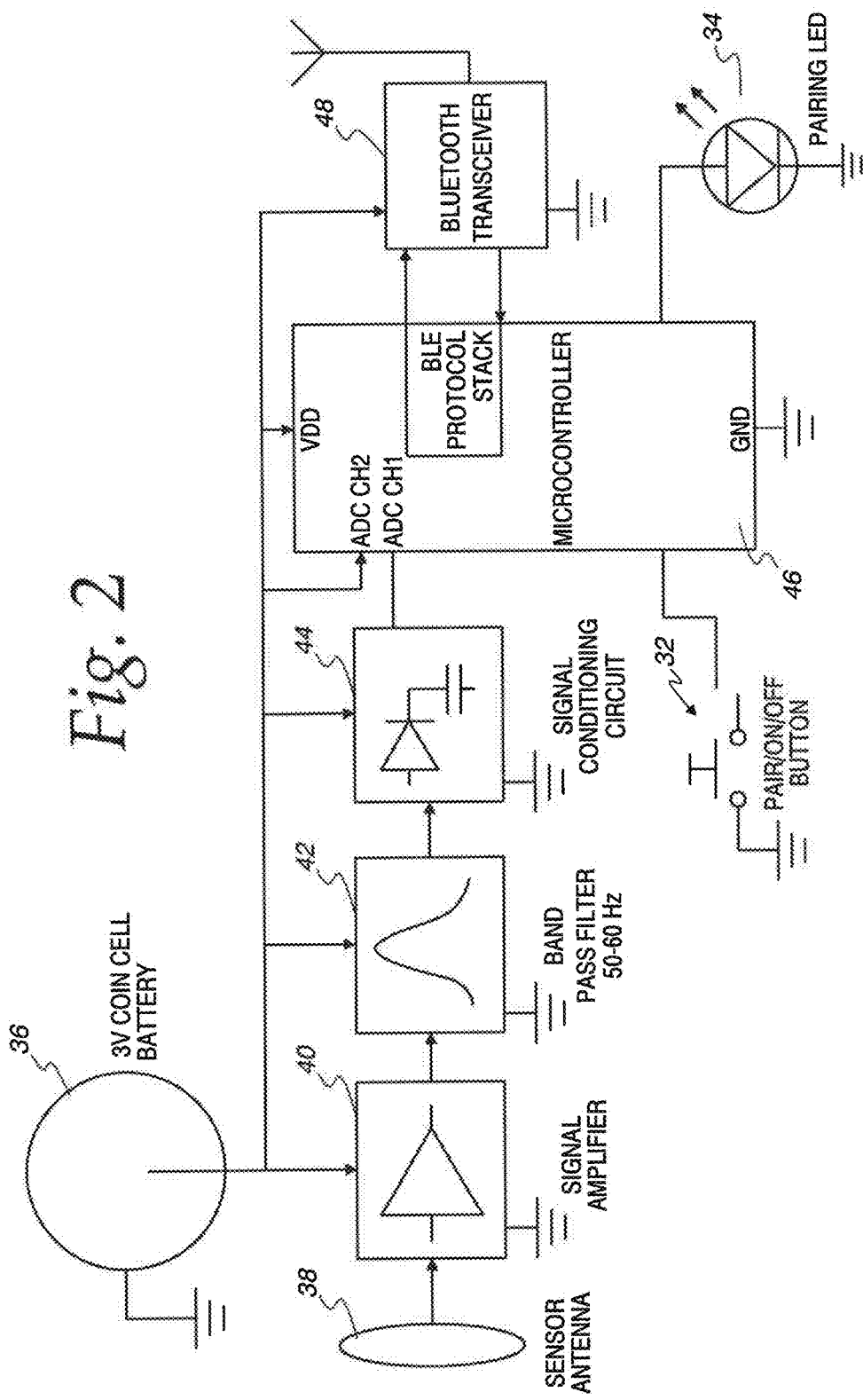
FIG. 2 is a block diagram of the electric field sensor.
Figure 3:
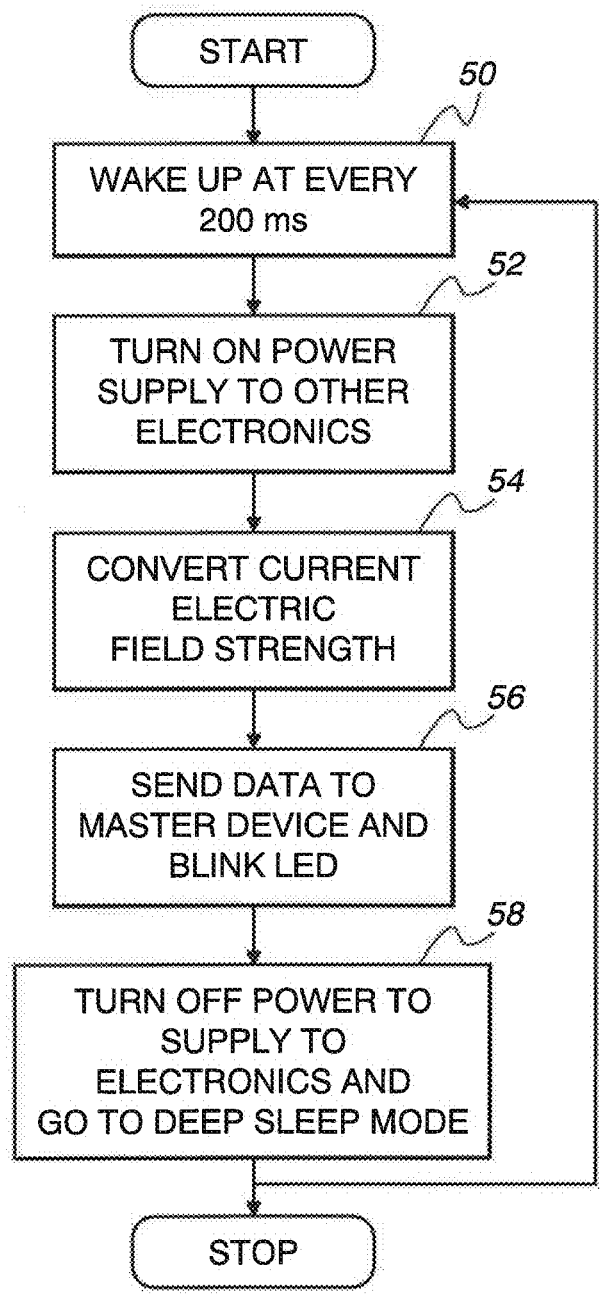
FIG. 3 is a flow diagram illustrating a program implemented in a microcontroller of FIG. 2.

Referring to FIG. 3, a flow diagram illustrates a program implemented in the microcontroller 46 of FIG. 2. The program begins at a block 50 which wakes up the microcontroller 46 at a predetermined time interval, which in an illustrated embodiment is on the order of 200 ms. The microcontroller 46 then turns on power supply to other circuits at a block 52 and receives the signal representing measured field strength and converts the signal to a data format at a block 54. The data is then transmitted to the alert device 24 or 26 at a block 56 using the transceiver 48. The program then turns off power at a block 58 and goes into a deep sleep mode and then returns to the block 50 to wait for the next cycle.

Referring to FIG. 4, the dedicated personal alert device 24 comprises a housing 100. The housing 100 is sized and adapted to be worn by a user and may include a belt clip on a back side or the like. The housing 100 includes a front alert LED 102F, a back alert LED 102B, a right alert LED 102R and a left alert LED 102L. As such, such, there is an LED 102 associated with each sensor 22. The housing 100 also supports a speaker 104, an on/off button 106, a pairing button 108, a low battery LED 110 and a pairing LED 112.

Referring to FIG. 5, a block diagram illustrates a circuit for a control 114 in the housing 100. The control 114 includes a microcontroller 116 in the form of a processor and associated memory for controlling operation of the personal alert device 24. The circuit is powered by a nine Volt battery 118 connected to a power control logic circuit 120 which develops appropriate voltage signals for powering the other circuitry. The on/off switch 106 is connected to the power control logic circuit 120 for turning the device 24 on and off. A battery monitor circuit 122 is connected between the power control logic circuit 120 and the microcontroller 116. The microcontroller 116 is also connected to the pairing button 108, the LEDs 110 and 112 as well as the front LED 102F, the left LED 102L, the back LED 102B and the right LED 102R. Also, the microcontroller 116 is connected via a boost switching regulator 124 to the speaker 104. Finally, the microcontroller 116 is connected to a Bluetooth® transceiver 126 for communication with the sensors 22.

As will be apparent, prior to initial usage it is necessary to pair the sensors 22 with the personal alert device 24. This is done by depressing the pairing button 108 on the alert device 24 and the button 32 on each of the sensors 22. Thereafter, this is also used to identify which of the sensors 22 is configured as the front, back, left and right sensors. This could be done, for example, by sequentially illuminating each of the LEDs 102F, 102L, 102B and 102R at the time each of the buttons on the individual sensors 22F, 22L, 22B and 22R is depressed.

Additionally, each of the LEDs 102F, 102L, 102B and 102R can be multiple colors. For example, one color can be used to indicate an alarm condition. Another color can be used to indicate communication status for the associated sensor, as described below.

Referring to FIG. 6, a flow diagram illustrates operation of a program implemented in the microcontroller 116 for detecting hazardous voltages and indicating direction of the source. The program begins at a block 130 which collects data for each sensor 22. The data is converted into field strength at a block 132. A block 134 sets a communication fail for any sensor which failed to send data. This can be used to illuminate one of the LEDs 102, as described above. A block 134 sets a low battery LED for any sensor 22 whose battery voltage is below a threshold. This can be done by the color of the LED 102. At a block 138, the signal strength for each sensor 22 is compared to a reference level to determine if an alarm condition exists for the associated direction. If so, then the corresponding sensor LED 102 is turned on to a particular color if it is more than the threshold. Also, the audio alert is provided via the speaker 104 if there is an alarm condition.

Thus, as described, the LEDs 102 can be used to indicate a communication failure, a low battery condition, or an alarm condition for an associated sensor 22 as well as identifying which of the four sensors the condition relates to. Particularly, any condition associated with the front sensor 22F is indicated using the front LED 102F. The same follows with the other directions.

The personal alert device 24 described above comprises a dedicated device for use in the described system. Alternatively, a conventional Smartphone 26 can be used programmed with a detector application program, or app, for implementing the functionality of the alert device. Such an app would operate in accordance with the flow diagram of FIG. 6.

Figure 7:
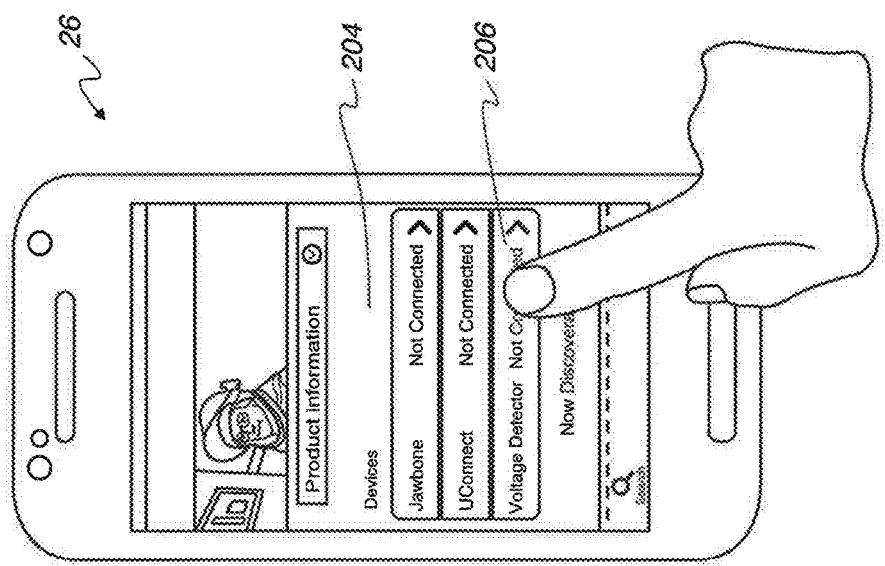
Figure 8:
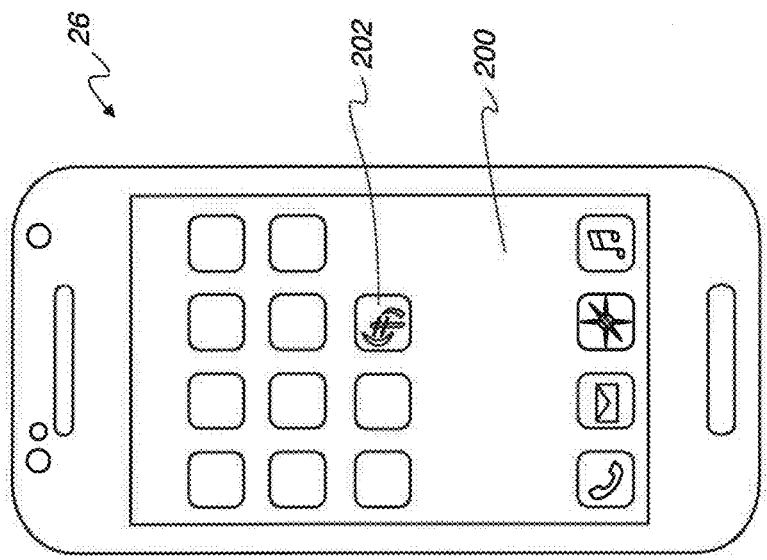

FIG. 7 illustrates a home screen 200 on the smartphone 26 including an icon 202 for the detector app. FIG. 7 illustrates a graphic display 204 for selecting various detection operations. As will be appreciated, the smartphone 26 can be used for additional alert functions, including the voltage detector function, indicated by a button 206, which is used to discover the various sensors. FIG. 9 illustrates a display screen 208 showing that the voltage detection function is on. Also, the display uses indicators of a particular color according to the status, such as using the color green to indicate that all sensors are active. The color associated with the particular sensor could change, for example, to gray if there is a communication failure. FIG. 10 illustrates a display screen 210, similar to that in FIG. 9, in which an audio alert is given, represented by 212, with an alarm condition and a screen showing directional detail by the left indicator turning to red. There is also a button 214 which allows a user to mute the alarm for a preselect time, such as one minute, and a button 216 to toggle a vibration function. Otherwise, the app operates in accordance with the program illustrated in FIG. 6 and described above.

Thus, the illustrated system comprises two components. The first is a jacket embedded with four sensors as well as the personal alert device. Each sensor comprises an ultra low power sensor powered using a coin cell battery and senses electric field and converts it to digital data for transmission to a master device. The sensor uses a field sensing antenna connected to a signal conditioning circuit provided to a microcontroller where it is converted to digital data to be sent to the master. The master alert device can be a dedicated device or a mobile phone, either configured with Bluetooth® transceivers. Either alert device runs an application program which pairs with each sensor and collects the information, including current field strength, battery status, RSSI, and IDD details from each sensor. The alert device processes the collected raw information from each sensor and generates the audio alarm and illuminates the corresponding directional LEDs when an alarm condition is found to exist.

Thus, the system provides omni-directional protection and thus provides increased safety for the user. The system does so by showing the direction of the live voltage source and comprises a hands free system allowing the user to concentrate on the work at hand. Additionally, the system provides the user with multiple modes of alert, comprising an audio signal, vibration and visual indication. Further, when used with a Smartphone, the data can be communicated to a supervisor at a central station for further analysis and decision making.

It will be appreciated by those skilled in the art that there are many possible modifications to be made to the specific forms of the features and components of the disclosed embodiments while keeping within the spirit of the concepts disclosed herein. Accordingly, no limitations to the specific forms of the embodiments disclosed herein should be read into the claims unless expressly recited in the claims. Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

The present system and method have been described with respect to flowcharts and block diagrams. It will be understood that each block of the flowchart and block diagrams can be implemented by computer program instructions. These program instructions may be provided to a processor to produce a machine, such that the instructions which execute on the processor create means for implementing the functions specified in the blocks. The computer program instructions may be executed by a processor to cause a series of operational steps to be performed by the processor to produce a computer implemented process such that the instructions which execute on the processor provide steps for implementing the functions specified in the blocks. Accordingly, the illustrations support combinations of means for performing a specified function and combinations of steps for performing the specified functions. It will also be understood that each block and combination of blocks can be implemented by special purpose hardware-based systems which perform the specified functions or steps, or combinations of special purpose hardware and computer instructions. None of the methods according to various aspects disclosed herein is limited to performing the steps thereof in any particular order.

The invention claimed is:

1. A personal voltage detection system comprising:
   a plurality of wearable electric field sensors each adapted to be worn on an outer side of a user's body each facing a different direction, each sensor comprising a transducer sensing electric field and transmitting a wireless signal representing field strength for an associated direction; and
   an alert device in operative communication with the plurality of sensors and comprising a control configured to monitor field strength for each sensor and determine existence of an alarm condition responsive to field strength being above a preselect level and to generate an alarm signal indicating the associated direction of the alarm condition.

2. The personal voltage detection system of claim 1 wherein the alert device further comprises an audio output generating an audio signal responsive to the alarm condition.

3. The personal voltage detection system of claim 1 wherein the alert device comprises an indicator associated with each direction and the control illuminates the indicator for the associated direction of the alarm condition.

4. The personal voltage detection system of claim 3 wherein the alert device comprises a video display including a graphic display with the indicators for each direction.

5. The personal voltage detection system of claim 1 wherein the alert device comprises a smart phone.

6. The personal voltage detection system of claim 1 wherein the alert device includes an indicator to indicate communication status with the plurality of sensors.

7. The personal voltage detection system of claim 1 wherein the alert device comprises an indicator associated with each sensor and the control varies each indicator to indicate communication status for the associated sensor.

8. The personal voltage detection system of claim 1 wherein the sensors and the alert device communicate using short-wavelength radio waves.

9. The personal voltage detection system of claim 1 wherein the sensors and the alert device are battery powered.

10. A personal voltage detection system comprising:
a garment to be worn by a user and carrying a plurality of electric field sensors each facing a different direction, each sensor comprising a transducer sensing electric field and transmitting a wireless signal representing field strength for an associated direction; and
an alert device in operative communication with the plurality of sensors and comprising a control configured to monitor field strength for each sensor and determine existence of an alarm condition responsive to field strength being above a preselect level and to generate an alarm signal indicating the associated direction of the alarm condition.

11. The personal voltage detection system of claim 10 wherein the alert device further comprises an audio output generating an audio signal responsive to the alarm condition.

12. The personal voltage detection system of claim 10 wherein the alert device comprises an indicator associated with each direction and the control illuminates the indicator for the associated direction of the alarm condition.

13. The personal voltage detection system of claim 12 wherein the alert device comprises a video display including a graphic display with the indicators for each direction.

14. The personal voltage detection system of claim 10 wherein the alert device comprises a smart phone.

15. The personal voltage detection system of claim 10 wherein the alert device includes an indicator to indicate communication status with the plurality of sensors.

16. The personal voltage detection system of claim 10 wherein the alert device comprises an indicator associated with each sensor and the control varies each indicator to indicate communication status for the associated sensor.

17. The personal voltage detection system of claim 10 wherein the sensors and the alert device communicate using short-wavelength radio waves.

18. The personal voltage detection system of claim 10 wherein the sensors and the alert device are battery powered.

* * * * *